(12) United States Patent
Joshi

(10) Patent No.: US 8,161,423 B1
(45) Date of Patent: Apr. 17, 2012

(54) DEFECT FILTERING OPTICAL VERIFICATION PROCESS

(75) Inventor: Devendra Joshi, San Jose, CA (US)

(73) Assignee: Cadence Design Systems, Inc., San Jose, CA (US)

(*) Notice: Subject to any disclaimer, the term of this patent is extended or adjusted under 35 U.S.C. 154(b) by 457 days.

(21) Appl. No.: 12/407,718

(22) Filed: Mar. 19, 2009

Related U.S. Application Data

(62) Division of application No. 11/102,206, filed on Apr. 9, 2005, now Pat. No. 7,530,048.

(51) Int. Cl.
*G06F 17/50* (2006.01)
(52) U.S. Cl. .......................... 716/53; 716/54
(58) Field of Classification Search .............. 716/51, 716/52, 53, 54, 55, 56
See application file for complete search history.

(56) References Cited

U.S. PATENT DOCUMENTS

| | | | | |
|---|---|---|---|---|
| 6,370,679 B1* | 4/2002 | Chang et al. | ..................... | 716/53 |
| 6,470,489 B1* | 10/2002 | Chang et al. | ..................... | 716/52 |
| 7,155,689 B2* | 12/2006 | Pierrat et al. | ..................... | 716/52 |
| 7,207,030 B2* | 4/2007 | Kuchler et al. | ................... | 430/5 |
| 7,530,048 B2* | 5/2009 | Joshi | .............................. | 716/53 |
| 2002/0175390 A1* | 11/2002 | Goldstein et al. | ............. | 257/481 |
| 2005/0052651 A1* | 3/2005 | Kim | ............................. | 356/433 |

* cited by examiner

*Primary Examiner* — Vuthe Siek
(74) *Attorney, Agent, or Firm* — Kenyon & Kenyon LLP

(57) ABSTRACT

An apparatus and method for optical lithography verification includes filtering a lithography simulation of proposed sub-lightwave pattern formations during at feast one design phase or manufacturing phase of an article of manufacture having sub-lightwave structures and then detecting design phase or manufacturing phase defects in response to the filtering of the lithography simulation.

24 Claims, 14 Drawing Sheets

DEFECT FILTERING OPTICAL VERIFICATION PROCESS

RELATED APPLICATION

This application is a divisional of and claims the benefit of U.S. patent application Ser. No. 11/102,206 filed Apr. 9, 2005 now U.S. Pat. No. 7,530,048, which is hereby incorporated herein by reference.

BACKGROUND OF PRIOR ART

Lithography manufacturability verification techniques have helped to improved mash designs and throughput of microcircuit production to some extend. However, as greater demands have been placed on semiconductor manufacturers to lower production costs and further increase throughput, while at the same time moving toward ever smaller feature dimension requirements, it is recognized that a new and improved LMV technique would be highly desirable.

BRIEF SUMMARY OF INVENTION

An apparatus and method for optical lithography verification includes filtering a lithography simulation of proposed sub-lightwave pattern formations during at least one design phase or manufacturing phase of an article of manufacture having sub-lightwave structures and then detecting design phase or manufacturing phase defects in response to the filtering of the lithography simulation.

BRIEF DESCRIPTION OF THE DRAWINGS

The above mentioned features and steps of the invention and the manner of attaining them will became apparent, and the invention itself will be best understood by reference to the following description of the preferred embodiment(s) of the invention in conjunction with the accompanying drawings wherein.

DETAILED DESCRIPTION OF THE PREFERRED EMBODIMENTS OF THE INVENTION

Methods and apparatuses for helping a user (layout designer, engineer, etc.) quickly and easily detect, classify, and report defects in a design phase or manufacturing phase of an optical lithography process are disclosed. The following description is presented to enable any person skilled in the art to make and use the invention. For purposes of explanation, specific nomenclature is set forth to provide a thorough understanding of the present invention. Descriptions of specific applications, methods, and apparatus are provided only as examples. Various modifications to the preferred embodiments will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
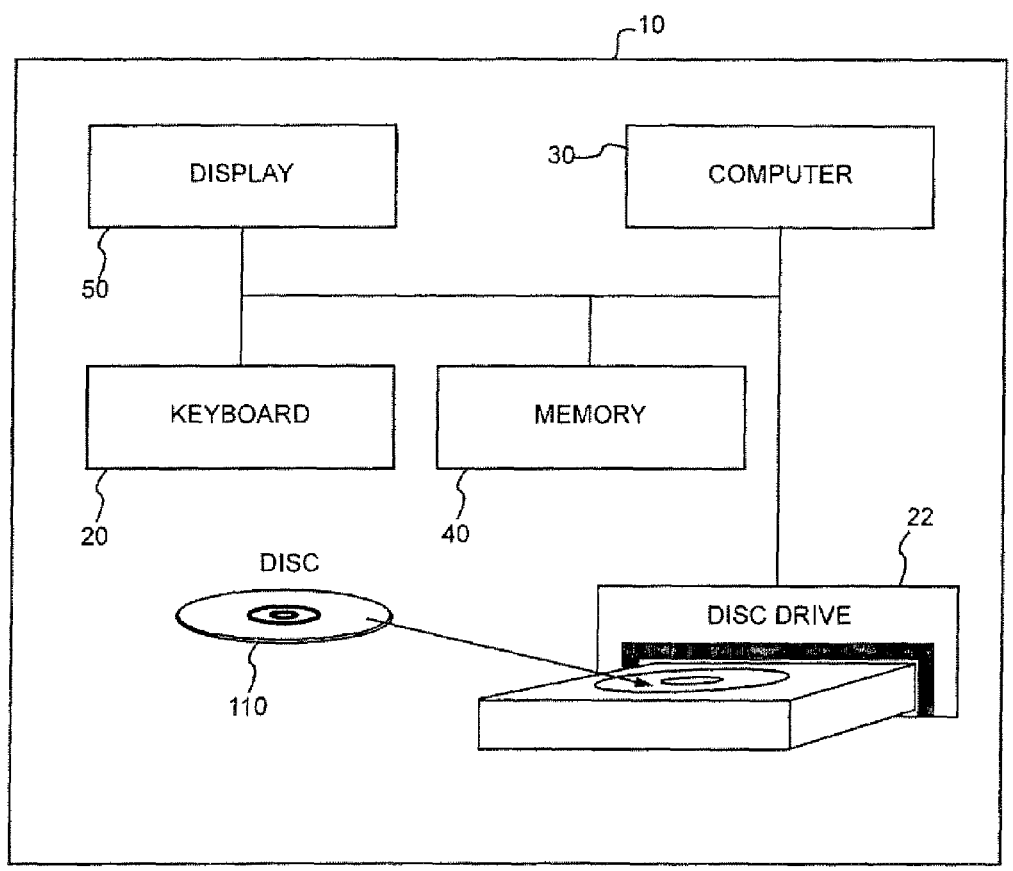
FIG. 1 is a diagrammatic illustration of a computer-aided design system, which system is constructed in accordance with an embodiment of the present invention.
Figure 3:
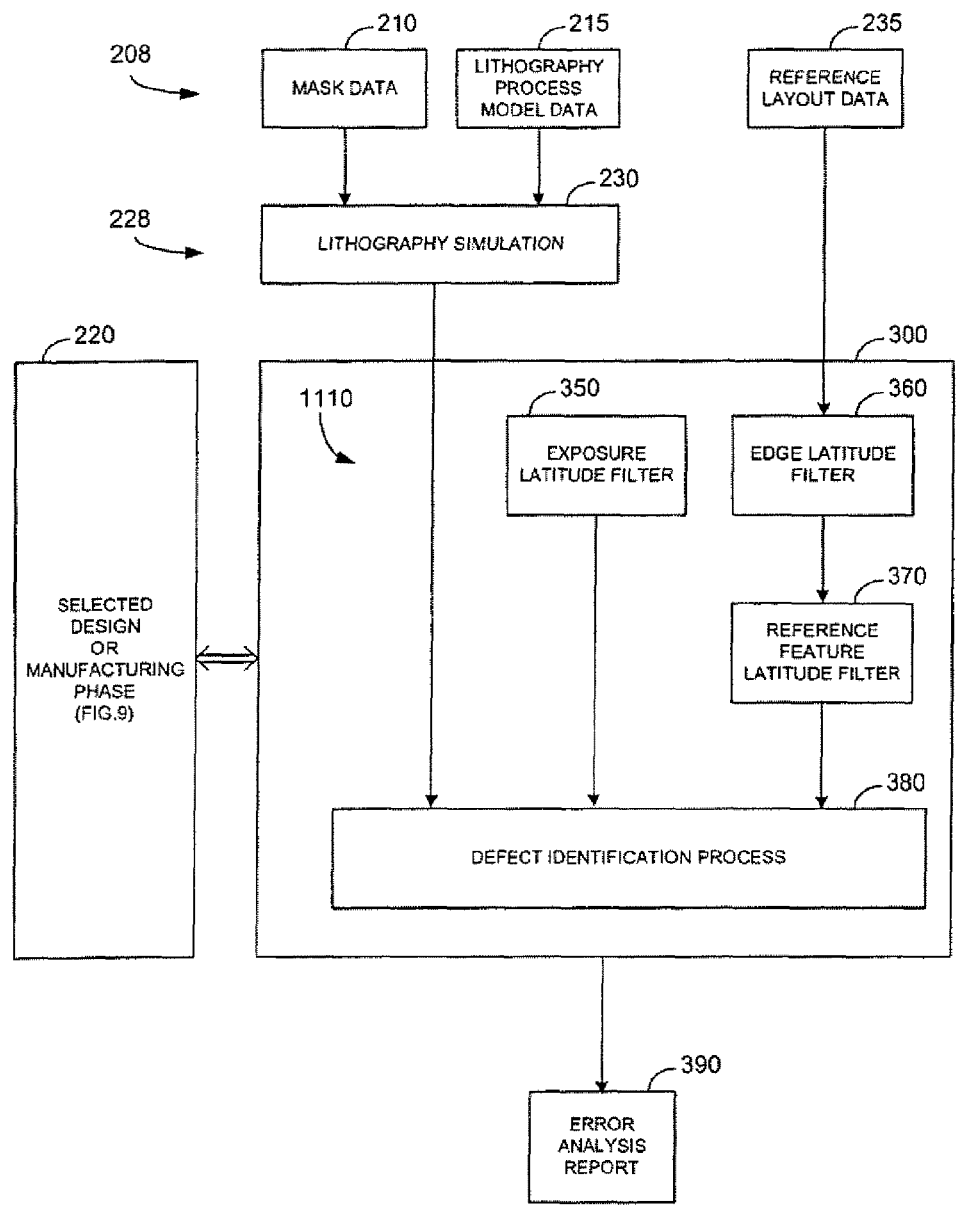
FIG. 3 is a diagrammatic flowchart of a method of lithography manufacturability verification based on filter generation and application, which method is in accordance with an embodiment of the present invention.

Referring now to the drawings and more particularly to FIGS. 1 and 3 thereof, there is illustrated a computer-aided design (CAD) system 10, which is constructed according to one of the preferred embodiments of the present invention. In this embodiment, the CAD system 10, through a computer readable program product 110, implements a lithography manufacturability verification (LMV) technique 1110 (FIG. 3) in an optical lithography process. More particularly, by application of the lithography manufacturability verification process 1210 to a lithography simulation, such as the simulation 230, a determination is made whether a proposed mask solution as applied to a silicon wafer, creates errors that would effectively decrease the throughput of a nano-circuit production run. The computer-aided design system 10, and the LMV technique 1210, as applied to a proposed design will be described hereinafter in greater detail.

Before discussing the preferred embodiment of the present invention in greater detail, it may be beneficial to briefly review the design of integrated circuits with reference to sub-lightwave length optical lithography as applied to an article of manufacture having sub-lightwave length nanostructures.

Design of integrated circuits comprises functional design and physical design. During the functional design, a design concept is described using a hardware description language and is then converted into a netlist which specifies the electronic components and the electrical connections between the individual components.

Physical design determines the placement of the components on a silicon wafer or chip and the routing of their connections, also referred to as, "place and route". The physical design process generates the physical design data, which is synonymously called layout data, layout, or target layout.

Layout data is further analyzed to verify mapping between logical design and physical design. In this regard, the layout data is verified to ensure a performance specification, especially in terms of timing, power and signal integrity is achieved. If everything goes well during the verification process, the design is handed over for manufacturing. This milestone is referred as "design tapeout."

Figure 11A:
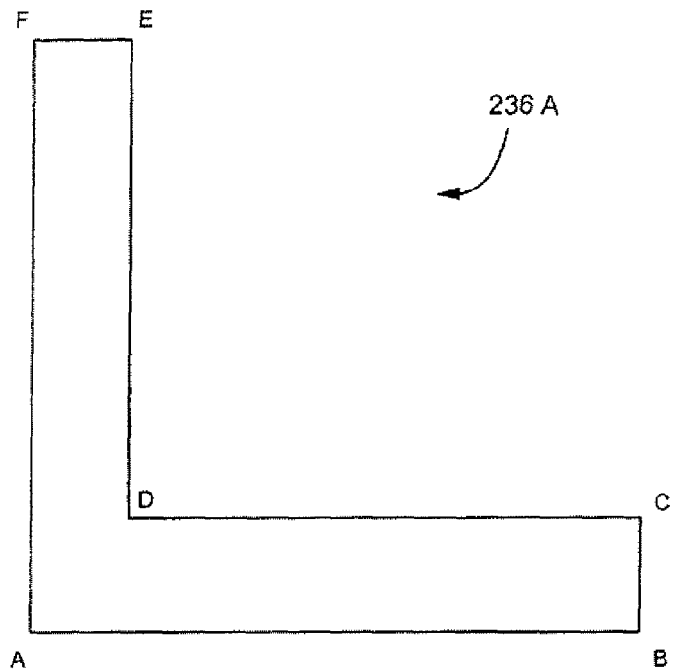
FIGS. 11A-D illustrate edge latitude filter and feature latitude filter.
Figure 11B:
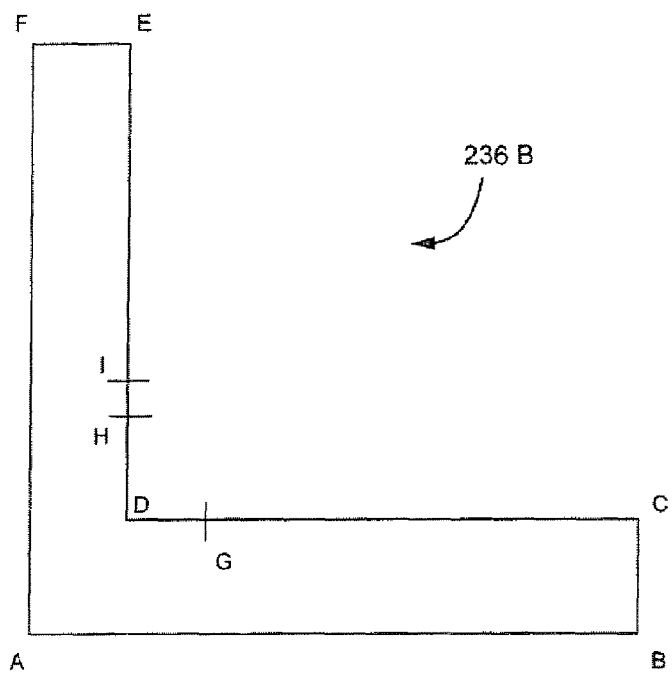

Considering now the layout data in greater detail, the layout data, such as layout data 235 (FIG. 3) describes the structure patterns a user designer would like to render on an integrated circuit. It is usually different than the pattern that is actually rendered on the integrated circuit, and is usually very different than the pattern submitted for the mask making process. The target layout defines a set of binary patterns, where each pattern is a set of polygons, which are called "features" or "geometric features." Each feature can be a part of an electronic component such as a gate of a transistor or a connection between components. Examples of features are shown in FIGS. 11A B, where each illustrated feature consists of multiple edges. For example, a feature 236A (FIG. 11A) has multiple edges AB, BC, CD, DE, EF and FA. On the other hand, a feature 236B (FIG. 11B), which has an identical shape to feature 236A, but in this case, the feature 236B has multiple edges AB, BC, CG, GD, DH, HI, IE, EF, and FA. In this regard, it should be noted that the inner corner indicated at D, has three associated segment edges GD, DH, and HI.

Often the physical design data is stored and transmitted in a machine-readable format, such as GDSII, OASIS, or in a database format, such as Open Access or Milkyway. For examples see "Open Access: The Standard API for Rapid EDA Tool integration," 2003 by Si2, Inc., and various Internet presentations that provide additional information regarding Milkyway.

Those skilled in the art will understand that some patterns in a nano-circuit design are placed multiple times in the layout data. This duplication, of course, requires large amounts of storage space. To reduce data size and to improve efficiency, layouts are generally described hierarchically in order to avoid repeatedly describing the same structure in detail. In this regard, a cell is a subset of a pattern that can be referenced as a whole object. Cells can be included in the layout by reference. Inclusion by reference can be nested.

Semiconductor device manufacturing comprises many steps of patterning layers according to the layout data. A layer is either the substrate of the semiconductor wafer or a film deposited on the wafer. At some steps, a pattern is etched into a layer. At some other steps, ions are implanted in a pattern into the layer.

Patterning comprises: lithography, and etch or implant. Generally, patterning comprises; lithographic exposure, resist development and resist etching.

The prevalent form of lithography is optical projection lithography, which involves making a mask or reticule that embodies the pattern to be projected onto the wafer; optically projecting an image of the mask onto a photoresist film coated on the wafer; exposing the photoresist; and developing the latent image, thereby making a stencil on the wafer.

Mask data refers to that data, which is submitted to the mask making process, or the data that is sent to a spatial modulator of a mask-less lithography instrument. All patterning processes, however faithful, distort the structure image to some extent. The pattern that is etched into a layer of the wafer therefore, is not an exact scaled replica of the mask pattern. The target layout, the mask data, and the pattern resulting on the wafer are of distinct patterns.

Modern lithography prints features that are smaller than the exposure wavelength. In this regime, which is called the low-k1 regime, the field and wave nature of light is prevalent, and the finite aperture of the projection lens acts as a low-pass filter of spatial frequencies in the image. The resulting image distortion, called optical proximity effect, is responsible for the most significant distortion in transferring a mask pattern onto a wafer.

Optical Proximity Correction (OPC) is the process of changing, or predistorting, the mask data, so that the pattern etched in the wafer is a close replica of the target layout. OPC is a numerically intensive calculation that transforms the target layout into mask data. The goal of OPC is to counter the distortions caused by the physical patterning process (see A. K T Wong, Resolution enhancement techniques in optical lithography, SPIE Press, Vol. TT47, Bellingham, Wash., 2001; and H. J. Levinson, Principles of Lithography, SPIE Press, Bellingham, Wash., 2001).

Application of today's resolution enhancement technologies (RET), can also have the effect of changing the layout data relative to the lithography data. RET also addresses distortion in the lithography process by pre-compensation. Typically, RET involves implementing a resolution enhancement technique such as the insertion of sub-resolution assist features (SRAF), phase shift enhancement using an attenuated phase mash, or designing a mask that includes quartz etching to introduce phase shifting across features. This is well discussed in Chapter 3 of "NanoCMOS Circuit and Physical Design" by B. Wong et al, Wiley, 2004.

As the complexity of integrated circuit design and manufacturing has increased, the desire to verify if the resulting shapes indeed create the desired wafer image has steadily grown. This verification is referred by different names like optical rule check ORC, lithography rule check LRC, and silicon vs. layout check. In this document when reference is made to this type of optical lithography verification, it will be identified as "lithography manufacturability verification" (LMV). The LMV process 1110 can be performed on a whole chip or locally on a small layout region.

Figure 2A:
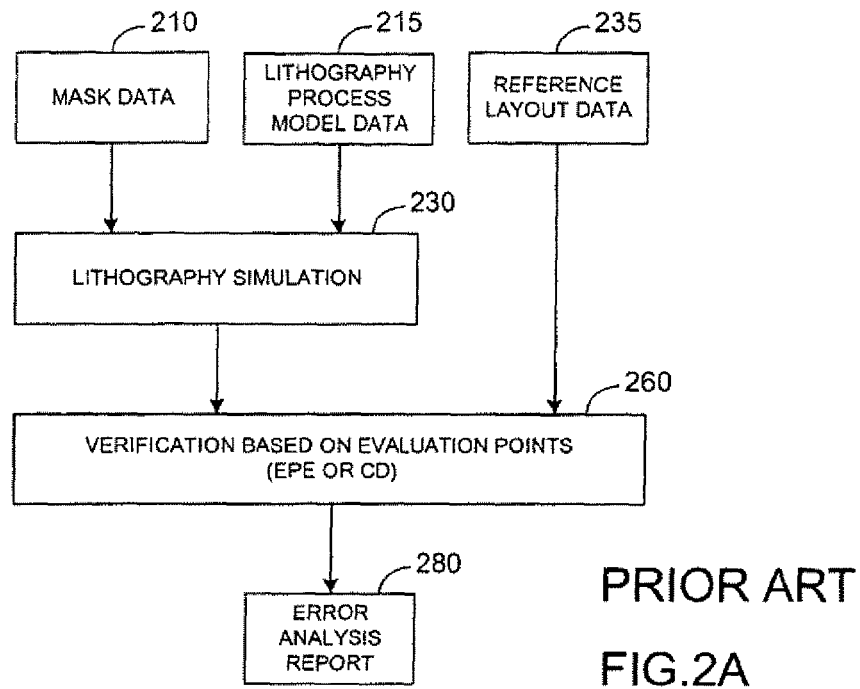
FIG. 2A-B are diagrammatic representations of prior art lithography manufacturability verification processes.
Figure 2B:
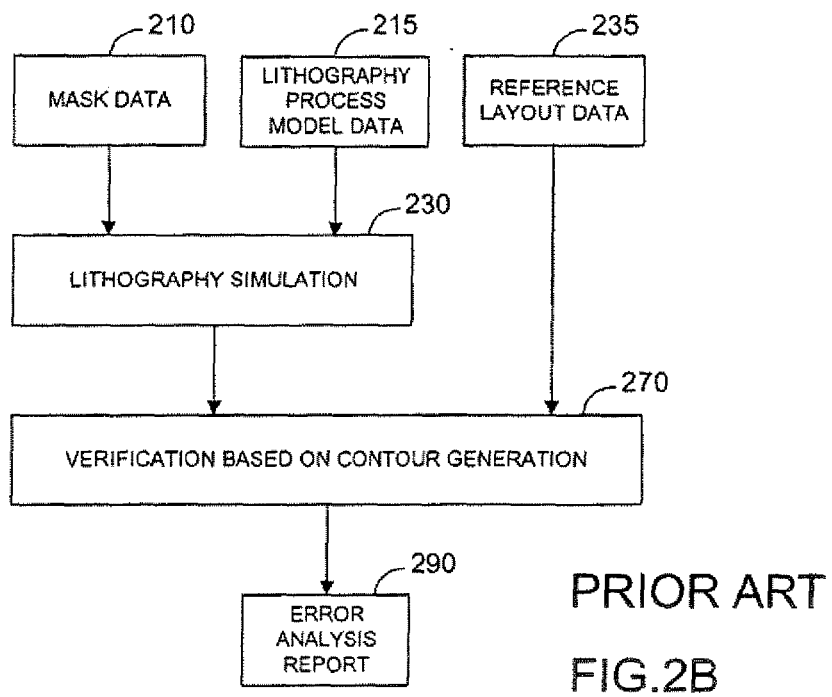

There are two prior art solutions of LMV, which are illustrated in FIGS. 2A and 2B; namely, an LMV process 260, based on evaluation paints (FIG. 2A), and an LMV process 270, based on contour generation (FIG. 2B). Each of these solutions will be considered hereinafter in greater detail.

For the moment before considering the prior art solutions of LMV in greater detail, it should be understood that in order to perform LMV, a designer must provide a lithography simulation 230 and a set of reference data 235, which is indicative of design intent. Additionally, in order to generate or provide a lithography simulation, a user must also supply a set of mask data 210, and a set of lithography process model data 215. The mask data 210 can be different than an original layout design because of the application of RET; OPC etc. and thus, the resulting simulation 230 needs to be analyzed for manufacturability. The lithography process model 215 applies the manufacturing lithography conditions to the simulation 230. The lithography simulation 230 generates simulation images or intensity values. This includes aerial image, resist, etch etc., where the intensity value is also referred as exposure value or dose.

Broadly then, an LMV process involves detecting feature printability and verifying whether it has printed correctly or not. Printability in this instance can be analyzed using aerial image, resist, etch, etc.

Considering now the LMV process 260 based on evaluation points in greater detail with reference to FIG. 2A, in this scheme, evaluation points are determined on the reference layout data 235. These points are mostly located on polygon edges. The evaluation points are then defined by a set of rules. The verification is done by analyzing the printable edge segment near the evaluation point. The verification is discrete and is error prone, as some errors will not be detected because of the lack of an evaluation point. The rule definition is complex and it is extremely difficult if not impossible to have an exhaustive verification. For example, side-lobes are defects printed by proximity and lithography effects only and there is no overlapping reference polygon at these locations. The LMV process 260 cannot detect nor correct side-lobes.

Considering now the LMV process 270 based on contour generation in greater detail with reference to FIG. 213, in this method contour is generated for a particular intensity value. The generated contour is then compared with target polygons. This is expensive in terms of time and data size. Once contours are generated geometric Boolean operations are performed to compare contours and target polygons. Contours are generated for a constant intensity value. In this regard, if verification is done for multiple intensity values, then large quantities of contour data must be generated.

The prior art solutions just discussed are limited to either discrete verification based on evaluation points or contour based verification at a particular intensity value that consumes enormous amounts of time as well as significant amounts of storage data.

Multiple vendors have developed tools using these prior art techniques, for example, reference can be made to the following: "Calibre ORC" from Mentor Graphics of Wilsonville, Oreg., "SiVL from Synopsy, Mountain View, Calif., "Tachyon" from Brion Technologies, Santa Clara, Calif. and "Halo-Sim" from Aprio Technologies, Santa Clara, Calif. Reference can also be made to the following for additional examples of such prior art technology:

Loana Graur et al. (Proc. SPIE Vol. 5379) describes a methodology similar to the contour generation process 270;

T. Kotani et al. (Proc. SPIE Vol. 5379) discloses a methodology in which a layout is simulated under a variety of process conditions. The information obtained is used to define the vales similar to process 260, Chang et al. U.S. Pat. No. 6,370,679 and U.S. Pat. No. 6,470,489 describe a methodology whereby a layout is first OPC corrected in a hierarchical fashion. The post OPC layout is there used as the input to a simulation tool, which creates the predicted printed image of the corrected layout. The differences between the desired image as defined in the original layout and the actual printed image are then compared; and Jérôme Belledent et al. (Proc. SPIE Vol. 5377) discloses a methodology of generating lithography modeling which is similar to the evaluation process 260.

Considering now the characteristics of a correctly manufactured feature in greater detail, a correctly manufactured feature has the following characteristics:

A feature can be represented by printable edges. Printable edges are placed according to lithography effect.

Dose and focus are important control factors for edge placement.

A feature is acceptable if it matches the dimension requirements.

Dimension requirements are influenced by functional characteristic of the device and lithography process.

Figure 9:
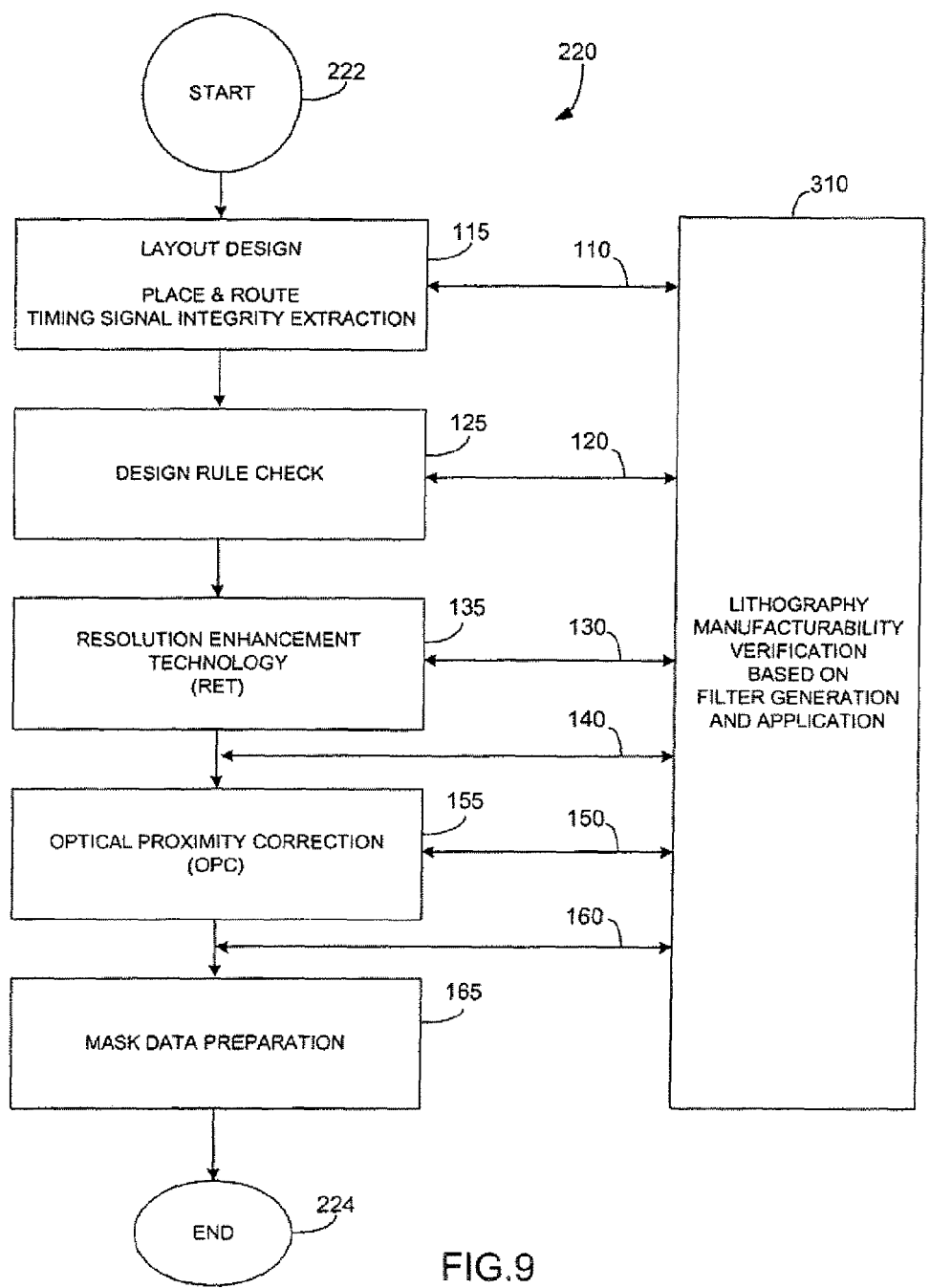
FIG. 9 illustrates different stages of integrated circuit design and manufacturing relative to the lithography manufacturability verification process of FIG. 3.

Having now briefly reviewed the prior art LMV processes, and the characteristics of correctly manufactured nano-structure features, the novel LMV method 1110 of the present invention will now be considered in greater detail with reference to FIGS. 1, 3 and 9. In the preferred embodiment of the LMV method 1110, an exhaustive full chip LMV is executed with reduced computational time by filtering the correctly manufactured features in the chip. In this regard, the non-filtered features are the manufacturing defects. Stated otherwise, the novel method 1110 of full chip LMV determines defects by:

1) Representing the chip as a simulation grid and performing a simulation to obtain an intensity value for each grid point.

2) Defining an intensity range that results in printable edges.

3) Defining an acceptable feature halo shape;

4) Filtering the non-printable regions by using a defined intensity range.

5) Filtering the valid printable regions by using a layout data halo.

For the purpose of understanding the present preferred embodiment, two nonstandard technical terms will now be introduced; namely, "feature latitude" and "edge latitude."

Figure 5:
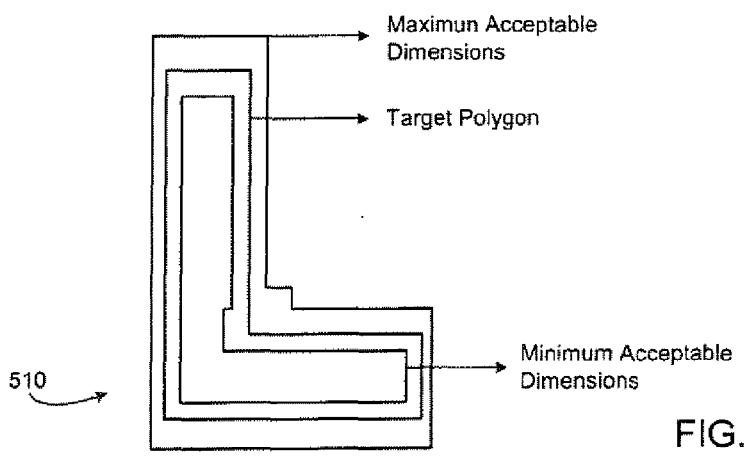
FIG. 5 is a diagrammatic example of a feature latitude filter as applied on the output derived from the lithography simulation of FIG. 4.
Figure 11C:
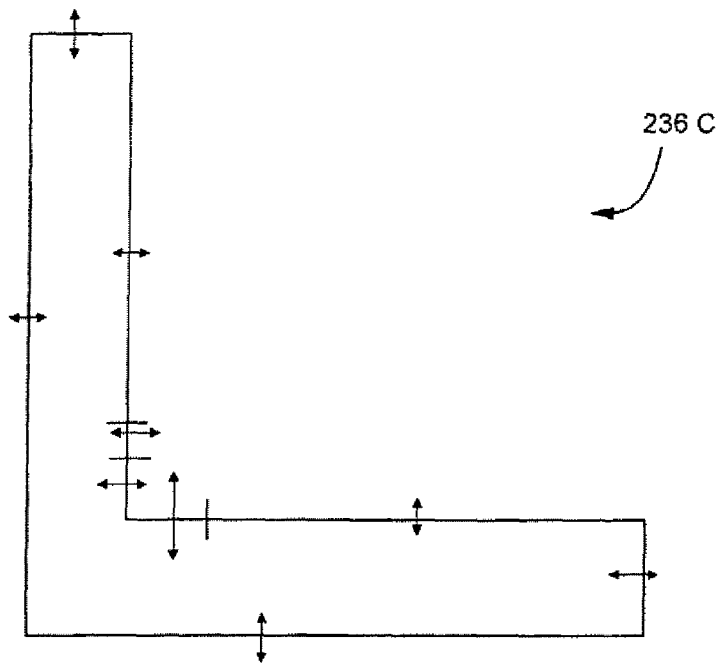
Figure 11D:
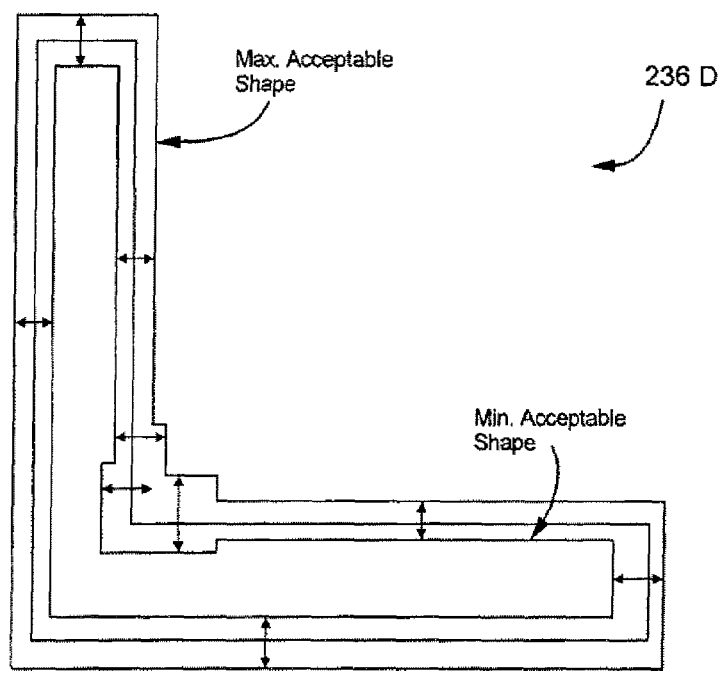

Feature latitude represents the halo around a feature that represents the acceptable feature dimensions, where the feature consists of multiple edge segments (see for example, FIGS. 11A B). In this regard, each edge segment has edge latitude that represents the acceptable displacement of edge segment. For example, FIGS. 5 and 11C illustrate the feature latitude obtained by a combination of edge latitude.

In the preferred embodiment of the LMV process 1110, an exposure latitude filter 350 is applied to the lithography simulation 230. In this regard, the exposure latitude filter 350 is indicative of the range of intensity values within which the feature linewidth is manufactured within desired linewidth tolerances. These intensity values are generally determined by lithography experimentation with test structures. In short then, the exposure latitude filter 350 represents the manufacturing behavior of the various lithographic processes involved in the design phases and the manufacturing phases of creating a nano-circuit chip.

Considering now the LMV method 1110 in still greater detail with reference to FIG. 3, line the prior art methods the LMV method 1110 starts with a gathering or providing step indicated generally at 208, where the user provides mask data indicated generally at 210, lithography process model data indicated generally at 215 and reference layout data indicated generally at 235.

The mask data 210 and the lithography process model data 215, once entered into the CAD system 10 (FIG. 1), is utilized at a generating step 228 to generate a lithography simulation indicated at 230. However, unlike the prior art systems, which directly utilize the reference layout data 235 in executing an LMV process, the novel LMV method 1110 instead, generates a set of latitude filters that will be described hereinafter in greater detail. It will suffice for the moment to indicate that three software filters are generated, an exposure latitude filter 350, an edge latitude filter 360, and a reference feature latitude filter 370. The edge latitude filter 360 and the reference feature latitude filter 370 are generated using the reference layout data 235. The edge latitude filter 360, is only utilized to generate the reference feature latitude filter 370. Although three filters 350, 360, and 370 are generated, only the exposure latitude filter 350 and the reference feature latitude filter 370 are actually applied to the lithography simulation 230 as will be described hereinafter in greater detail.

Before continuing, it should be mentioned that the exposure latitude filter 350 is indicative of a range of intensity values within which the feature linewidth is manufactured within desired linewidth. In this regard, the intensity values are generally determined by lithography experimentation with test structure. In short, the exposure latitude filter 350 represents the manufacturing behavior of a lithographic process.

It should also be noted that the reference feature latitude filter 370 is for whole chip filtering, and is indicative of the correctly manufactured features. Therefore, the reference feature latitude filter 370 helps facilitate the filtering of the correctly manufactured features. Finally, it should be noted that the exposure latitude filter 350 when applied to the lithography simulation 230 removes those intensity values, which are indicative of non-printable regions derived from the simulation output at step 228.

The novel LMV method 1110 may be applied to one or more of various design and manufacturing phases in a lithography process. In this regard, as best seen in FIG. 3 and FIG. 9, the designer utilizing the CAD system 10, chooses at least one of the phases illustrated generally at 220. In this regard, after the novel method 1110 has been applied to one of the design or manufacturing phases as indicated in FIG. 9, the method 1110 may be initiated again for a different one of the design or manufacturing phases. In greater detail then, the selection process 220 begins at a start command 222 and proceeds to a layout design phase step 115. If a layout design phase is in process, an LMV processor 310, which implements the LMV process 1110, initiates an interact step 110. If the layout design phase is not in process, the process advances to a design rule check phase at 125.

At step 125, the LMV processor 310 initiates an interact step 120 if the design rule check phase is in process. Otherwise, the process continues to an RET phase check at step 135.

At step 135, the LMV processor 310 initiates an interact step 1303 if the RET p phase is in process. Otherwise, the process continues to an OPC phase check at step 155. However, since the LMV process 1110 can be applied both pre and past OPC phase, the LMV processor 310 initiates an interact step 140 if a pre OPC phase check is in process. If not, the LMV processor 310 initiates an interact step 150 if the OPC phase is in process. If the OPC phase is not in process, the LMV processor 310 makes a final check to determine if a post OPC phase is in process. If the OPC post phase is in process the LMV processor 310 initiates an interact step 160. Otherwise the LMV processor waits for the next phase check.

Next a mask data preparation phase check is considered at step 155. If the mask data preparation is in process the LMV processor 310 initiates action to consider this phase, and then lets the process go to an end step 224. As the LMV processor 310 and the LMV process 1110 coordinate action with one or more of the different design phase and manufacturing phase operations, there is no intention of limiting the scope of the present invention to a single design or manufacturing phase verification.

Continuing now, the novel method 1110 determines which design and manufacturing phase is being considered for verification and then applies the exposure latitude filter 350 and the reference feature latitude filter 370 to the lithography simulation 230. The application step 380 to apply the filters 350 and 370 to the lithography simulation 230, results in a determination of whether any defects have been detected in the proposed design.

In this regard, there are generally three types of defects that may be detected at step 380 depending sport the design or manufacturing phase that is being considered. The different types of defects include:
1. Features that print wrongly,
2. Features that are missing and did not print at all, and
3. Extra artifact features, such as side-lobes or printed sub-resolution assist features. It should be noted, that the sub-resolution assist features are part of mask data and are utilized for references but should not be printed or reproduced in a resulting wafer.

Once the errors have been detected as previously described, the next step is to complete an error analysis so an error analysis report can be generated at a report step 390. The error analysis varies depending on the usage scope of the LMV process 1110. In this regard, the defect analysis can include any one or more of the following:

Defects in term of size,
Defects in term of edge placement error; i.e. the distance the printed edge displaced from the intended edge position;
Defect density or area within a region;
Defect in a layout feature, shape segment or edge;
Defect in terms of circuit performance or operation As an integral part of conducting the error analysis, the various detected errors are also classified to help facilitate generating a clear and meaningful error report. The error report is generated at step 390 and provides the user with a report of defects by classification. After receiving the error report at 390, a determination can be made as to whether the method 1110 should be applied to another design phase or another manufacturing phase depending upon if further verification is needed. if no other design or manufacturing phase verification is required, the process ends. Otherwise, the process is repeated as previously described.

As noted earlier, principally two types of filters are applied to the lithography simulation 230, namely the exposure latitude filter 350 and the reference feature filter 360. These filters provide a mechanism to filter the correctly manufactured features in the chip. Each of these filters will now be considered in greater detail with reference to FIG. 3.

Considering now the generation of the exposure latitude filter 350 in greater detail with reference to FIGS. 3 and 5, the exposure latitude filter 350, is a simulated intensity range, which may also be a single value as well. The exposure latitude filter 350 is utilized to identify the printable edges in the lithographic simulation 230. The intensity in this case, is the intensity or intensity range to focus in the lithography simulation result, while the edges in this case, are those edges that can be associated with any one or more of the following: wafer, etch, resist, aerial image or mask. Intensity implies the energy applied in the lithographical manufacturing process. A lithographical manufacturing has a target exposure but it can vary in the actual length of the manufacturing process. This change, in target exposure happens because of physics, chemistry and some random conditions involved in the manufacturing process. In short then, intensity values are generally determined by characterizing lithography manufacturing process. These values can come directly from the manufacturing place as a general guideline.

The exposure latitude filter 350 is also generated by determining the lithography process model data 210 and experimenting with actual reference layout data 235 or the mask data 210 or even various test structures (not shown). In this method of generating the exposure latitude filer 350 there is a desired linewidth for certain critical features and corresponding acceptable linewidth variation. For example, critical transistor gates are designed with 65 nm and are accepted if the manufactured linewidth is between 62 nm and 68 nm. Further, the target intensity is 0.25 for 65 nm linewidth, minimum intensity related to 62 nm linewidth is 0.21 and maximum intensity related to 66 nm is 0.30. Then, the exposure latitude filter is expressed as range between 0.21 and 0.30.

Considering now the generation of the edge latitude filter 360, and the reference feature latitude filter 370, in greater detail with reference to FIGS. 3 and 5, consideration must first be directed to the reference layout data 235. In this regard, the reference layout data 235 is the design intent of the designer and consists of multiple features. A feature in this case, consists of multiple edge segments, such as multiple edge segments associated with the L-shape feature 510 (FIG. 15). FIG. 5 illustrates edge latitude for each of the edge segment of feature 510. Stated otherwise, FIG. 5 illustrates how much an edge can be displaced inward or outward. This deviation range is indicative of the edge latitude filter 360. Also, the summation of edge latitude filter generates the minimum acceptable feature shape and maximum acceptable feature shape. Feature latitude therefore, as stated earlier, represents the acceptable feature dimension.

It should be noted by those skilled in the art, that the filter values can become more and more precise as we reach close to the manufacturing target. In a layout design phase, for example, one can start with lenient filters and make the filters more accurate as the results reach close to manufacturing, especially in post OPC. The LMV process, in this regard, in each phase is done to facilitate next phases, where the end goal is to manufacture the design intent.

Figure 4:
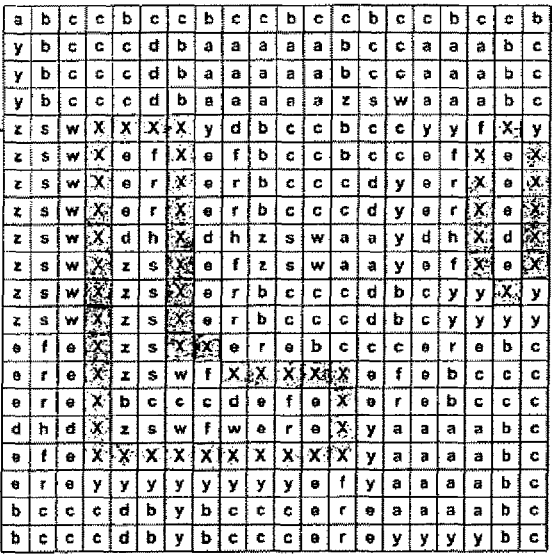
FIG. 4 is a diagrammatic example of a lithography simulation illustrating a layout grid of discrete intensity values.
Figure 7:
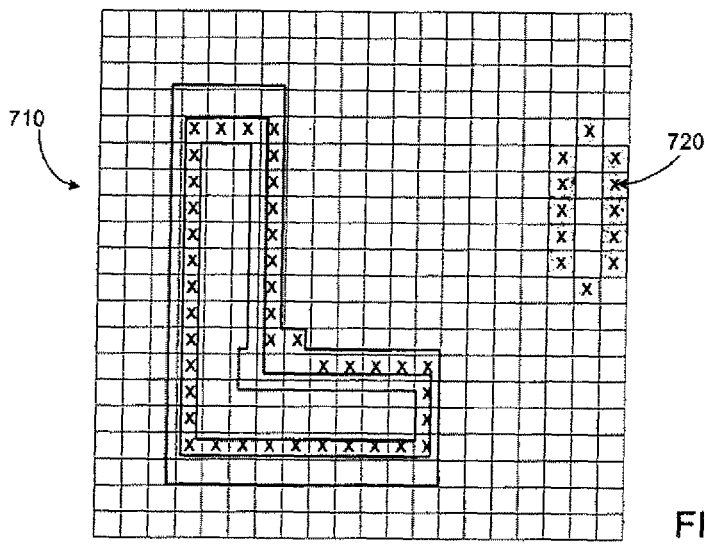
FIG. 7 is a diagrammatic example of the effect of an edge latitude filter.

Considering now the LMV process 1110 in still greater detail, FIGS. 4 7 are illustrative examples to help better understand the LMV process as shown in FIGS. 3A B. In this regard, FIG. 4 is an illustrative example of a lithography simulation 410, such as the lithography simulation created at the simulation step 230. In this regard, the simulation 410 illustrates different intensity values (represented by alphabetical letters, such as a, b, c, d, and so on, through x, y, and z) on a simulation grid indicated generally at 412. For the purpose of further instructive insight, assume in FIG. 4, the exposure latitude is given by equation 1:

|min<|target<|max where, range (|min, |max=x       Equation 1

Figure 6:
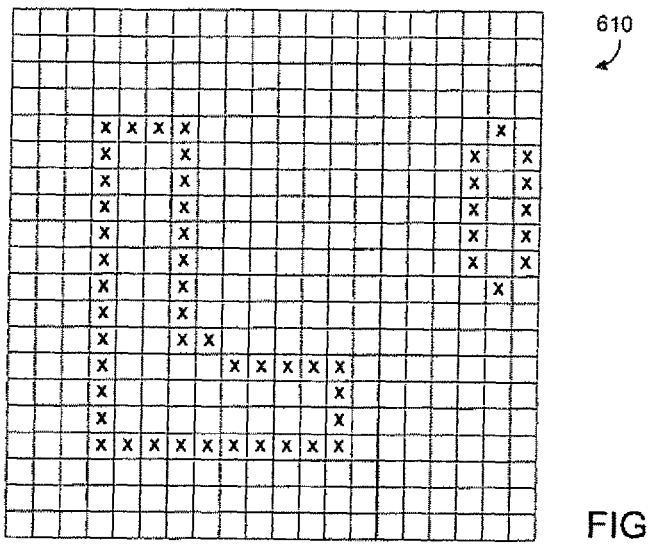
FIG. 6 is a diagrammatic example of printable features generated by the application of an exposure latitude filter on the simulation output illustrated in FIG. 4.

Now FIG. 6 illustrates a printable feature 610, which feature 610 is generated by applying an exposure latitude filter "x" on the simulation output shown in FIG. 4. This is illustrated diagrammatically in FIG. 4, where the exposure latitude filter "x" is shown with a darker gray background, which corresponds to the representation in FIG. 6.

Next, using the simulation output shown in FIG. 4, and applying both the exposure latitude filter "x" and a simulated feature latitude filter 510 indicated generally at 710 in FIG. 7, a series of detected defects are found, where individual defects are shown by a mark "x" at a defect area 720 (FIG. 7).

Considering now the lithography simulation 230 in greater detail with reference to FIG. 3, it should be understood that the simulation results can be represented in a grid or matrix format, and that filtering will generate sparse data. The sparse data, in this case, can be represented as grid, matrix or sparse matrix.

The grid can also be analyzed as a bitmap. The bitmap represents the full chip. Each bit in the bitmap or grid print represents some region of the full chip in the continuous manner. From manufacturability perspective, applying exposure latitude filter 350 can generate a bitmap representing the printable edges where a bit is on if it represents a printable edge segment. Feature latitude filter 370 can generate a bitmap representing the acceptable features where a bit is on if it represents a valid edge segment. The LMV process based on generated and applied filters can be performed by comparing two bitmaps. In this regard, to give more implementation details:

Step 1: Assume simulation result for layout data as a grid.
    Step 2: Filter this grid using exposure latitude filter to generate bitmap. If a bit is on, say value 1, it implies printable segment. If bit is off, say value 0, it implies nonprintable segment. Call this BitmapEL.
    Step 3: Create a bitmap for the reference layout data using feature latitude filter. Here a bit is on if it represents the acceptable feature. Call this BitmapFL.
    Step 4: Defect detection e.g. in simple terms:
    BitmapEL SUBTRACT BitmapFL=Things printed wrong and extra printing as well, such as side lobes. Call this BitmapW
    BitmapEL OR BitmapW=This is a union operation that expands the printed features. Call it BitmapP.
    BitmapFL SUBTRACT BitmapP=Features that were not at all printed i.e. missing features.
    BitmapEL CRY BitmapFL=All defects Mere SUBTRACT, OR and OR are Boolean operations.

Manufacturing process relative to optical lithography varies with focus. In this regard, each focus value can produce a different feature even with the same exposure latitude. Process sensibility analysis requires LTV through focus. One of the preferred embodiments of the present invention is targeted towards that in a LMV through focus method 1210 (FIG. 8) which is an enhancement of the LMV method 1110, as described earlier relative to FIG. 3.

Figure 8:
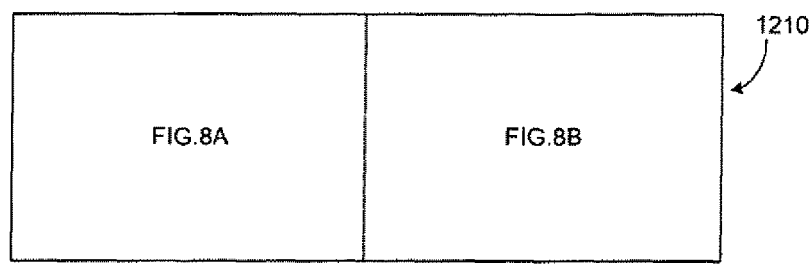
FIG. 8 is a diagrammatic flowchart of a method of lithography manufacturability verification through focus, which method is in accordance with another embodiment of the present invention.

Considering now the LMV through focus method 1210 in greater detail with reference to FIG. 8, the method 1210, like the earlier described LMV method 1110, starts with gathering the input data, which comprises gathering the mask data 210, the lithography process model data 215 and the reference layout data 235. This data will be utilized for each focus value that will be used in the sensibility analysis that will be described hereinafter in greater detail. For the moment it will be suffice to indicate that in the LMV through focus method 1210, the simulation process, generation of filters, defect detection and the subsequent error analysis is repeated for each focus value.

Figure 8A:
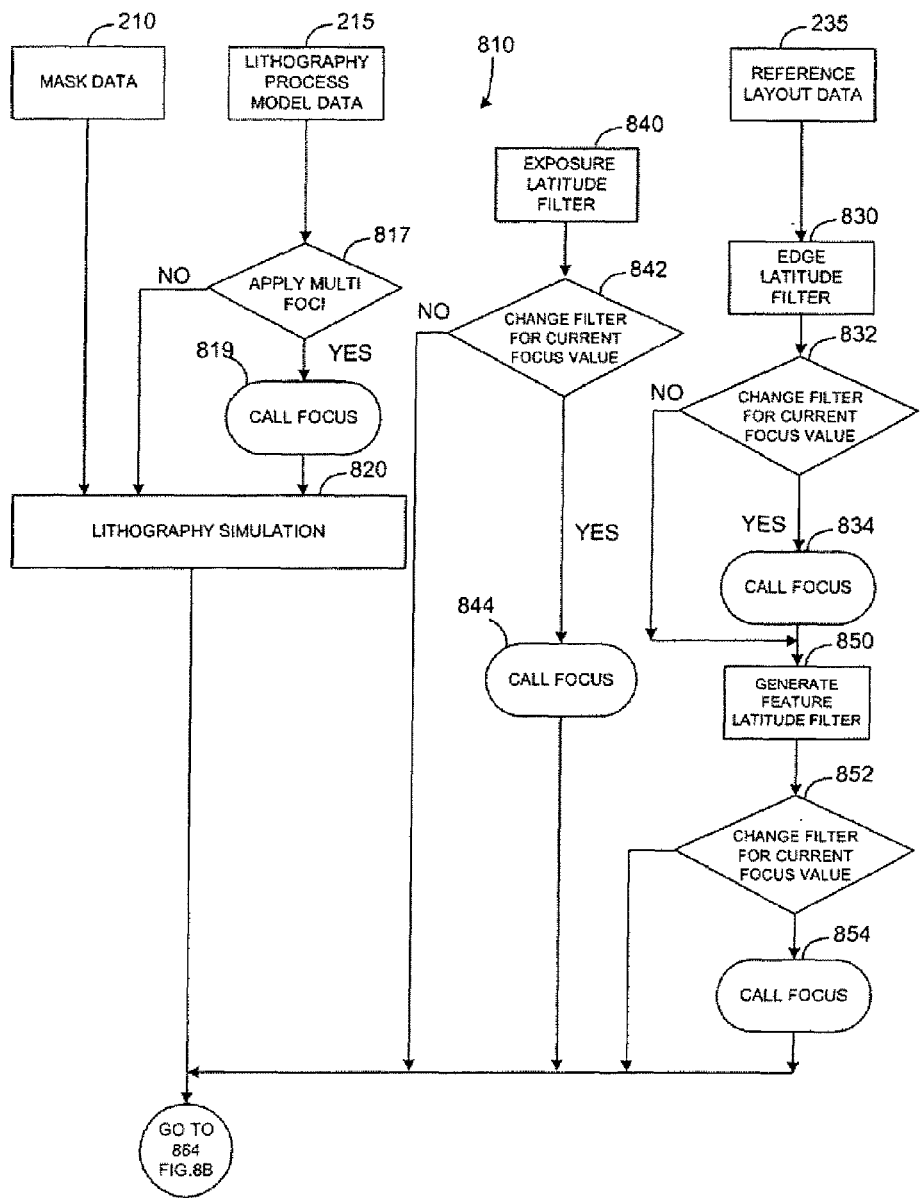

Since the method 1110 works for multiple foci, different focus values may be applied to the gathered lithography process model data 215, as illustrated generally at an apply focus process 810, as best seen in FIG. 8A. In this regard, a decision step 817 makes a determination whether another or a different focus value is to be applied to the lithography process model data 215. If this is not the case, the process immediately advances to a simulation step 820, that generates a lithography simulation using the mask data 210 and the lithography process model data 215 (with or without an applied focus value). If another or different or multiple focus value(s) is to be applied, the process advances to a call step 819; which calls an apply focus process. Since the application of single, or multiple focus values in elementary, the apply focus process will not be described hereinafter in greater detail.

After the apply focus process has been executed (by applying a desired focus value to the lithography process model data) the process advance to the simulation step 820. At step 820, the process causes a lithography simulation to be generated, where a desired focus value is applied. After the same or different focus value has been applied to the lithography simulation, the process advances to a the phase check process 1300 to check which type of design phase or manufacturing phase will be involved in the sensibility analysis that follows.

Before describing the phase check process 1300 in greater detail, it would be helpful to first consider the generation of the filters that will be applied to the lithography simulation. In this regard, an edge latitude filter is generated at a create step 830. A check is then made at a determination step 832 whether to change the filter for the current focus value. If not, the process proceeds to another create step 850, to generate a feature latitude filter. On the other hand, the edge latitude filter is to be changed, the process continues to a call step 834 which calls the apply focus process. After the specific focus value has been applied to the edge latitude filter the process proceeds to the create step 850, which causes the feature latitude filter to be generated.

Figure 8B:
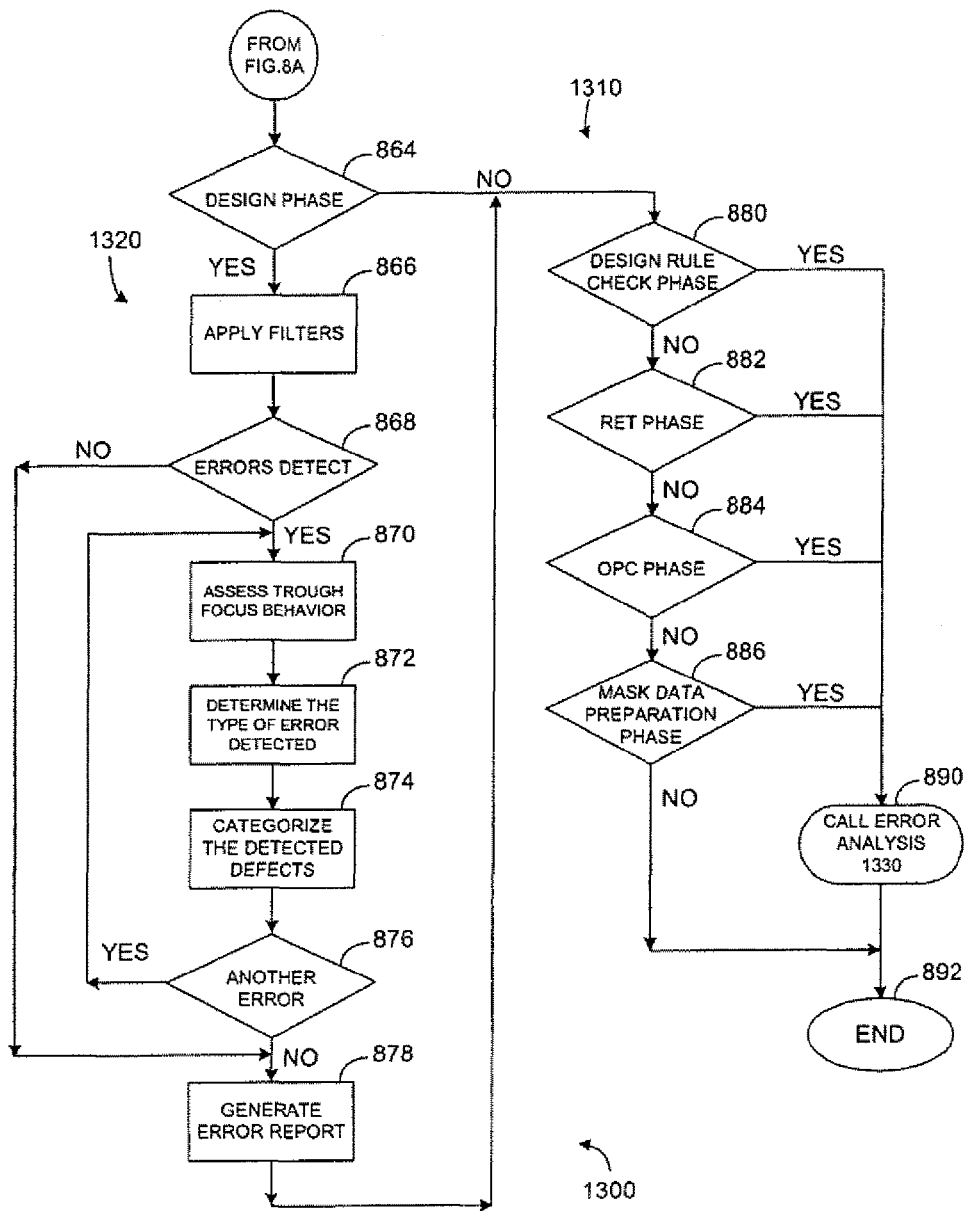

If the same or different focus value needs to be applied to the generated feature latitude filter before it is applied, the focus valve will be applied when the program proceeds to a determination step 852. At the determination step 852*a* determination is made whether to change the filter for the current focus value, or whether the same or a different focus value is to be applied to the feature latitude filter. If not, the process immediately advances to the phase check process 1300 (FIG. 8B). On the other hand, if the filter is to be changed, the process advances to a call step 854 which calls the apply focus process. After the feature latitude filter has been changed; the process goes to the phase check process 1300.

From the foregoing, it should be understood by those skilled in the art, that a specific focus value can be applied independently to the lithography process model data 215, the lithography simulation, the exposure latitude filter, the edge latitude filter or the feature latitude filter. Alternatively, a specific focus value, either of the same value or a different value, can be applied in a sequential manner as the process continues to the phase check process 1300. In summary then, the exposure latitude filter can be different for each focus value as in step 840. Similarly, the edge latitude filter of step 830 and feature latitude filter of step 850 can be different for each focus value. Applying these filters will generate defects for a particular focus value in relation to a specific type of design phase or manufacturing phase as will be describers in greater detail relative to the phase check process 1300.

Although, in the preferred embodiment of the L MV through focus method 1210, the process is described as sequential. it should be understood that the application of the focus values and their effects can be accomplished concurrently. For example, the simulation results from step 820, and the filters from steps 840 can be applied concurrently so the detected defects can be verified together. It should also be understood that the application of the filters may be done either sequentially or simultaneously.

Considering now the phase check process 1300 in greater detail with reference to FIG. 8B, the phase check process 1300 begins at a determination step 864 which determines whether the verification process is being applied to a lithography design phase. If not, the process then advances to a manufacturing phase check process 1310 to determine which one of a plurality of manufacturing phases the verification process is being applied. If the determination step 865 determines that the verification process is being applied to a lithography layout design phase, the process advances to a detect errors process 1320.

Considering now the detect errors process 1320 in greater detail with reference to FIG. 8B, the detect errors process 1320 begins immediately after a determination is made at step 864 that the verification process is being applied to a lithography layout design phase. In this regard, the process advances to an application step 866, which causes the filters (with specific focus values applied) to be applied to the lithography simulation. The application of the filters facilitates the detection of errors that may occur in the lithography layout design phase to be detected.

The detect errors process 1320 then proceeds to a check step 868 to determine whether the LMV through focus process 1210 has resulted in any errors being detected, if no errors have been detected, the process 1320 advances to a report generation step 378, which causes an error report to be generated. After the error report has been generated at step 878, the process advances to the manufacturing phase check process 1310.

If at least one error was detected at step 868, the detect errors process 1320 continues to an assessment step 870, which causes an assess through foes behavior command to be executed relative to an individual one of the errors. The process then proceeds to a determination step 872, which causes a determination command to be executed to determine which type of error was detected.

Once the type of error has been determined, the process advances to a categorize step 874 which categorizes the detected error into various categories of error types. The process then goes to a check step 876 to determine if any other errors have been detected.

If other errors have been detected the process returns to the assessment step 870 and proceeds as described previously. Otherwise, if no other errors have been detected, the process advances to the report generation step 878 and proceeds as previously described.

Considering now the manufacturing phase check process 1310 in greater detail, the manufacturing phase check process 1310 determines which one, if any, of a plurality of manufacturing phases is involved in the LMV through focus process. In this regard, the process 1310 advances through a determination step for each one of the manufacturing processes at steps 880, 882, 884, and 886 respectively. If none of the manufacturing processes are involved, the manufacturing phase check process 1310 as well as the LMV through focus process terminates at an end command step 892.

Considering now the LMV through focus process 1210 (as well as the LMV process 1110) in greater detail with reference to verification of manufacturing processes, it will be recognized by those skilled in the art that LMV can be applied at various stages or phases of integrated circuit design and manufacturing. However, the purpose of verification is different at each of the various stages. For example, in the design layout phase, LMV is utilized to assist with place and route, extraction and timing signal integrity. Because of the different phase consideration, vendors are now presently working on manufacturing awareness designs in order to help advance nano-circuit technology.

Using the manufacturing check process 1310, each one of the manufacturing phases will be examined and considered.

The manufacturing check process 1310 begins at a phase check step 880 to determine whether a design rule check phase is involved. In design rule checking it is known to those skilled in the art, that plain geometrical checking causes unwanted and undesired problems. In this regard, the application of LMV at this phase can help resolve issues in design rule checking. If a determination is made that the design rule check phase is not involved, the process advances to another phase check step 882 to determine whether resolution enhancement technology phase is involved. Otherwise, if design rule check is involved, the process proceeds to a call step 890, which causes an error analysis process 1330 to be called. Since the steps in the error analysis process 1330 are substantially identical to the steps executed in the detect errors process 1320 described earlier, the error analysis process 1330 will not be described, except to mention, that after process 1330 has been completed, the method advances to the end command 892 which terminates the LMV through focus process 1210.

LMV can also be used at a resolution enhancement technique (RET) phase, to identify trouble spots. Accordingly, at the check step 882, a determination is made as to whether an RET phase is involved in the LMV through focus process 1210. If yes, the process 1310 advances to the call step 890 and proceeds as previously described. If not, the process 1310 goes to another check step 884 to determine whether an optical proximity correction (OPC) phase is involved.

LMV may be utilized before an OPC phase is initiated to identify the hot spots, during an OPC phase on a local layout region to improve OPC; or even during a post OPC phase, where an exhaustive LMV is applied. Because of these benefits, the process at the check step 864 considers whether any one or all of these aspects of OPC are involved in the verification process. If so, the process advances to the call step 890 and proceeds as previously described. If not, the process goes to yet another check step 886 to determine whether a mask data preparation phase is involved in the verification process.

At the check step 886, a determination is made whether a mask data preparation phase is involved in the verification process. If so, the method proceeds to the call step 890 and proceeds as previously described. If not, the method proceeds to the end command step 892 and terminates the verification process.

Figure 10:
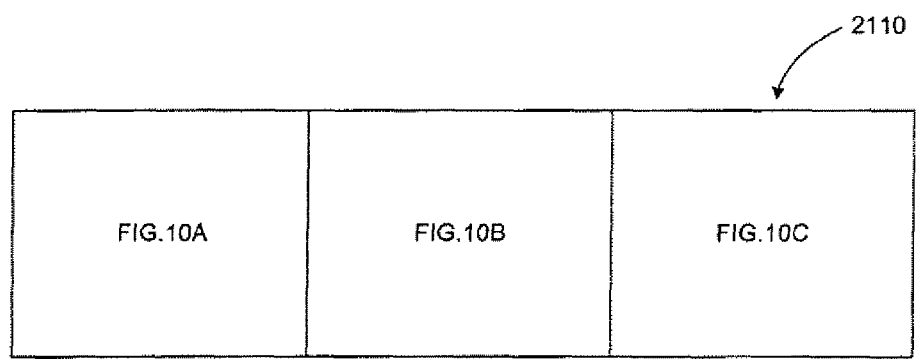
FIG. 10 is a diagrammatic flowchart of another method of lithography manufacturability verification, which method is in accordance with another embodiment of the present invention.

Referring now to the drawings and more particularly to FIG. 10, there is illustrated another preferred embodiment of a lithography manufacturability verification process 2110 which is also constructed in accordance with the present invention. The LMV process 2110 is similar to process 1110 except that it checks for applying the process 2110 to other design or manufacturing phases automatically.

Figure 10A:
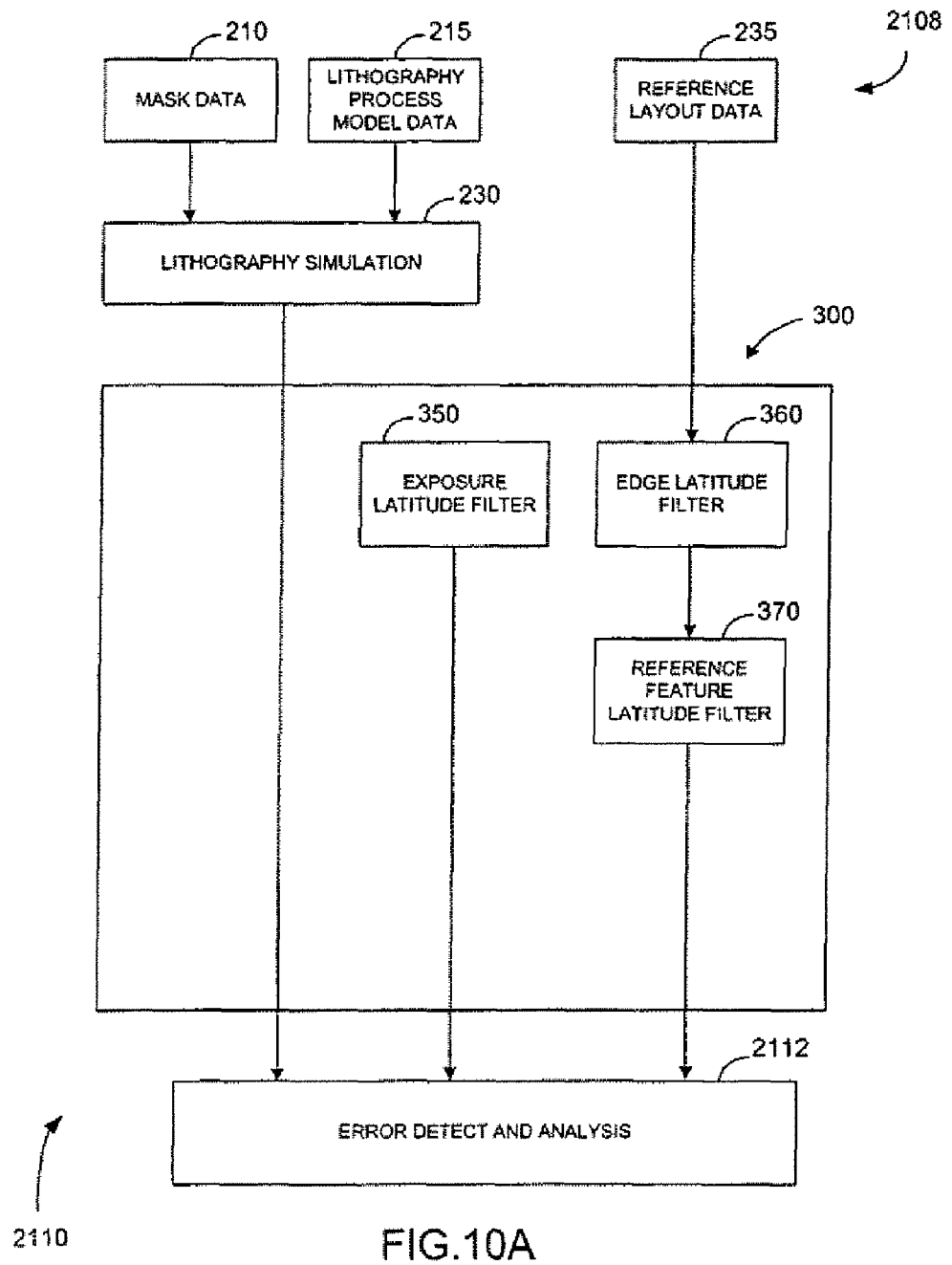

Considering now the LMV process 2110 in greater detail with reference to FIG. 10, the LMV process 2110 like process 1110 begins with a data gathering step indicated generally at 2108. The data gather step 2108 includes gathering a set of mask data 210, a set of lithography process model data 215 and a set of reference layout data 235. The gathered data as best seen in FIG. 10A is utilized in exactly the same manner as was described earlier. That is, the mask data 210, and the lithography process model data 215, are applied to generate a lithography simulation 230. Also, as previously described, the reference layout data 235 is utilized to generate an edge latitude filter 360 at a filter generation step indicated generally at 300.

At the filter generation step 300, the ether filters generated during the earlier described process 1110, are similarly generated. That is an exposure latitude filter 350 is generated and a reference feature latitude filter 370 is generated.

After the lithography simulation 230 and the LMV filters 350, 360 and 370 have been generated, the exposure latitude filter 350, and the reference feature latitude filter 370, are applied to the lithography simulation 230 during an error detect and analysis process indicated generally at 2112.

Figure 10B:
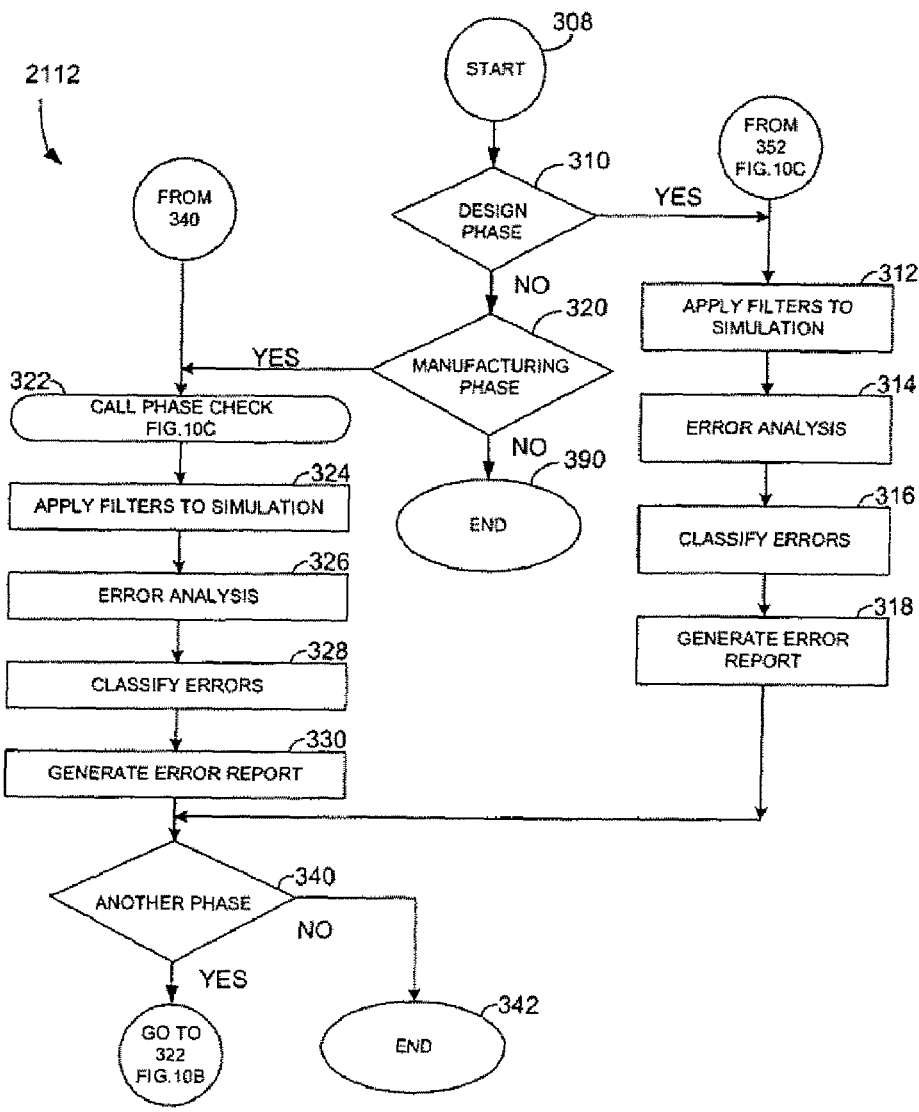

Considering now the error detect and analysis process 2112 in greater detail with reference to FIG. 10, the error detect and analysis process 2112, begins at a start step 303 (FIG. 10B). From the start step 308, the process 2112 advances to a check step 310, to determine whether a design phase requires verification.

If a determination is made at check step 310 that a design phase verification is required, the process 2112 advances to a command step 312, which causes the exposure latitude filter 350 and the reference feature latitude filter 370 to be applied to the lithography simulation 230. The action of applying these filters to the lithography simulation 230, in turn, causes defects in the design, if any, to be detected. The process 2112, then continues to an error analysis step 314, which causes the characteristics of each detected defect to be examined.

After considering the characteristics of each of the detected detects, the process 2112 does to a command step 316, which causes each detected error to be classified according to its defect type as previously discussed relative to process 1110. The process 2112 then advances to a command step 318, which causes an error report of the classified detects to be generated.

After the error report has been generated at step 318, the process 2112 jumps to a check step 340 to determine whether another design phase or manufacturing phase needs to be verified. If no other phase needs to be verified, the process 2112 goes to a step or end command at step 342. If another phase needs to be verified, the process 2112 goes to a call step 322, which causes a phase check process 345 to be called. The phase check process 345 will be discussed hereinafter in greater detail.

Considering again the check step 310 (FIG. 10B), if a determination is made at check step 310 that a design phase verification is not required, the process 2112 continues to another check step 320, to determine whether a manufacturing phase requires verification. If no manufacturing phase requires verification, the process 2112 proceeds to an end step 390.

If a determination is made at check step 320 that a manufacturing phase requires verification, the process 2112 goes to the call step 322, which initiates the phase check process 345, to determine which manufacturing phase (or another design phase) requires verification.

Figure 10C:
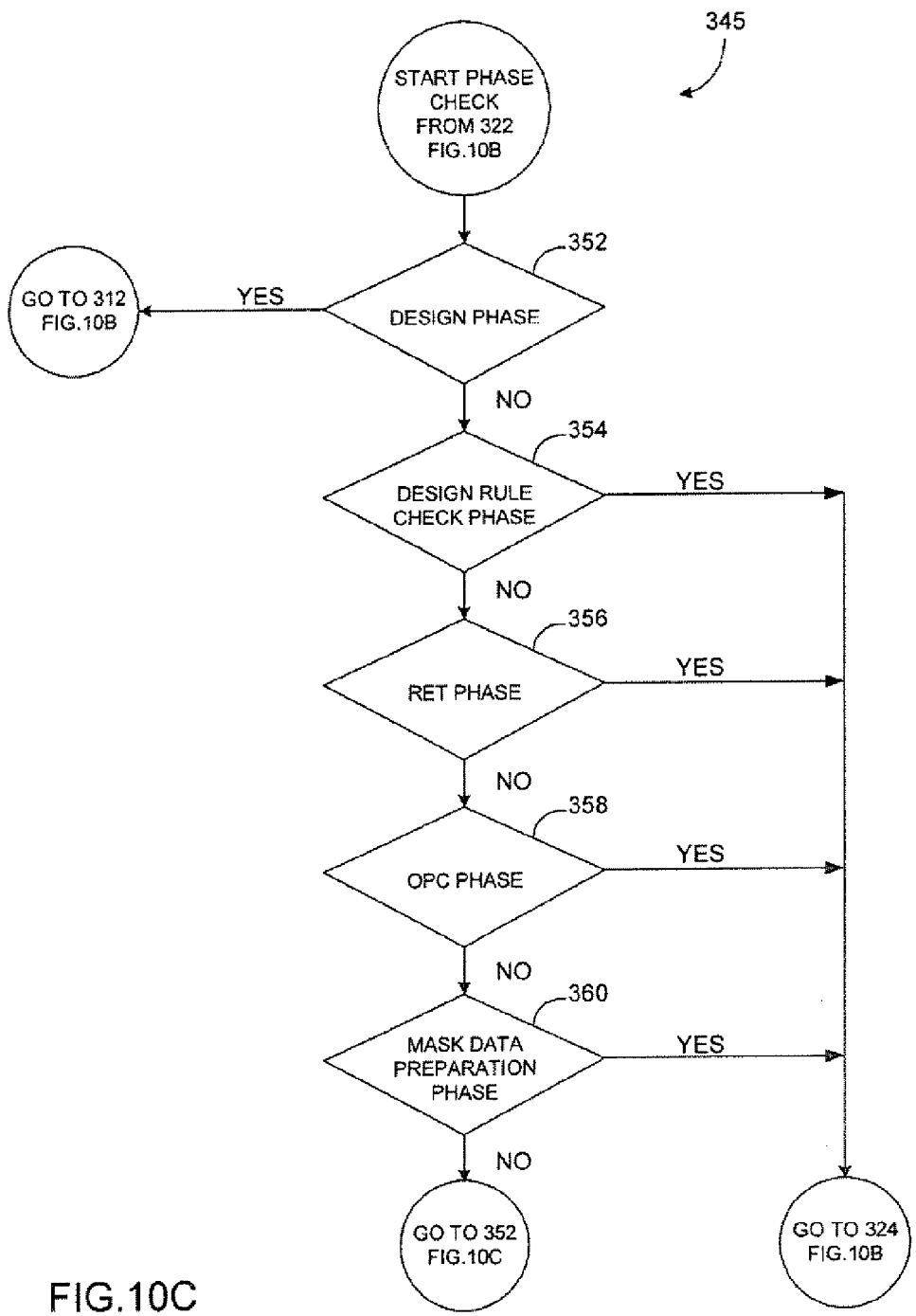

Considering now the phase check process 345 in greater detail with reference to FIG. 10C, the phase check process 345 is entered from the call step 322 (FIG. 10B) and immediately starts to determine whether another design phase verification is required at a design determination step 352. If another design layout phase verification is needed, the method returns to step 2108 to start gathering a new set of mask data 210, lithography process model data 215 and reference layout data 235. After gathering the new data, the process continues as previously described.

If a determination is made at step 352 that the design phase is not to be considered again for verification, the process 345 goes to a check phase step 354 to make a determination whether verification is required for a design rule check phase.

If a determination is made that a design rule check phase needs verification, the process jumps from the check phase process 350 to an apply filters step 324 which applies the exposure latitude filter 350 and the reference feature latitude filter 370 to the lithography simulation. Otherwise the process continues to determine which phase needs verification by proceeding to check phase step 355 to make a determination whether verification is required for an RET phase.

If a determination is made that a RET phase needs verification, the process jumps from the check phase process 350 to the apply filters step 324, which applies the exposure latitude filter 350 and the reference feature latitude filter 370 to the lithography simulation. Otherwise, the process continues to determine which phase needs verification by proceeding to a check phase step 358 to make a determination whether verification is required for an optical proximity correction (OPC) phase.

If a determination is made that an OPC phase needs verification, the process jumps from the check phase process 350 to the apply filters step 324 which applies the exposure latitude filter 350 and the reference feature latitude filter 370 to the lithography simulation. Otherwise, the process continues to determine which phase needs verification by proceeding to a check phase step 360 to make a determination whether verification is required for a mask data preparation phase.

If a determination is made that a mask data preparation phase needs verification, the process jumps from the check phase process 350 to the apply filters step 324 which applies the exposure latitude filter 350 and the reference feature latitude filter 370 to the lithography simulation. Otherwise, the process goes to step 390, which ends the process check and the LMV process.

Considering the LMV process 1110, after the filters 350 and 370 have been applied to the lithography simulation at step 324, the next step is to conduct an error analysis which comprises conducting an error analysis step 326, then a classification step 328 to classify the detected errors, and finally a report generation step 330 to generate a report of the detected and classified errors.

After the error analysis has been completed and the error report generated, the LMV process 1110 goes to a determination step 340 to determine whether further verification is required. If this is the case, the process proceeds to the call step 342 to call check process verification 350, which proceeds as previously described. If no further verification is required the LMV process 1110 goes to the end step 390.

Considering now the computer aid design system 10 in greater detail with reference to FIG. 1, the system 10 generally includes a computer 30 which is coupled to a set of input/output devices such as a keyboard 20, a disc drive 22, a random access memory 40, and a display 50. The disc drive 22 is capable of reading a computer usable medium or program product, such as a DVD disc 110, as well as recording, on a DVD disc, an error report, Considering now the computer program product 110, in greater detail with reference to FIGS. 1, 3 and 8, the computer program product 110 is a computer usable medium that has encoded thereon, computer readable cedes. The computer readable codes enable a user, via the CAD system 10, to cause at least one lithography manufacturability verification process to be executed. In this regard, the computer program product 110, has encoded thereon computer readable program code that causes the computer 30 to apply (with or without specific focus values) a set of filters to a lithography simulation of proposed sub-lightwave pattern formations during at least one design phase or manufacturing phase of an article of manufacture having sub-lightwave structures and then to detect design phase or manufacturing phase defects in response to the filtering of the lithography simulation.

More particularly, the computer readable program code encoded on the disc 110 causes the computer 30 to apply a plurality of filters, such as an exposure latitude filter and a reference feature latitude filter to a lithography simulation of proposed sub-lightwave pattern formations during at least one design phase or manufacturing phase of an article of manufacture having sub-lightwave structures to detect design or manufacturing errors in the simulation and then causing the computer 30 to detect design phase or manufacturing phase defects in response to the application of the different ones of the filters to the lithography simulation.

In summary then, the computer 30, which is a verification processor, in combination with the program product 110, causes the verification processor 30, in response to input data provided by a designer or user of the system 10, to provide a lithography simulation indicative of a plurality of intensity values in a proposed nano-circuit layout design; to apply a plurality of filters to the lithography; and the detect design phase or manufacturing phase defects in response to applying the plurality of filters to the lithography simulation.

Although preferred embodiments of the present invention have been described, it should be recognized, by those skilled in the art, that various modification are possible. For example, the simulation results can be represented as grid or matrix. Also filtering may generate sparse data, where the sparse data can be represented as grid, matrix or sparse matrix. The grid can also be analyzed as a bitmap, and the bitmap may represent the full chip. Each bit in the bitmap or grid point may also represent some region of the full chip in the continuous manner. Also from the manufacturability perspective, applying exposure latitude filter can generate a bitmap representing the printable edges where a bit is on if it represents a printable edge segment. The feature latitude filter can generate a bitmap representing the acceptable features where a bit is on if it represents a valid edge segment. In addition, LMV can be performed by comparing the two bitmaps. The described methods can be applied locally to a small area of the chip. Alternatively, the methods can be further applied to a specific type of edge segment life long edges, shape segment like corner or feature segment like gate. The described methods may use the hierarchy of the layout data and apply it to a single or specific instances of a cell.

In the preferred embodiment, the computer readable code has been described as being encoded on a disc 110 that can be entered into the computer memory 40 by the disc drive 22, which reads and transfers the code under computer control. However, it is contemplated that the code could be entered directly from the keyboard 20 or any other input device that is capable of communication with the computer 30. Therefore, while particular embodiments of the present invention have been disclosed, it is to be understood that various different modifications are possible and are contemplated within the true spirit and scope of the appended claims. There is no intention, therefore, of limitations to the exact abstract or disclosure herein presented.

What is claimed is:

1. A computer-implemented method of verifying manufacturability of a chip layout for a lithographic process, comprising:
   defining, in a computer system, a range of intensities within which a feature linewidth is manufacturable to represent manufacturing behavior of the lithographic process;
   defining, in the computer system, a feature latitude of acceptable feature tolerances that represents acceptable feature dimensions for the lithographic process; and
   applying, through the computer system, at least one of the range of intensities and the feature latitude to lithography simulation data for the chip layout to filter the simulation data based on manufacturability.

2. The computer-implemented method of claim 1, wherein the range of intensities is defined by an exposure latitude filter.

3. The computer-implemented method of claim 1, wherein the feature latitude is defined by a feature latitude filter.

4. The computer-implemented method of claim 1, wherein the step of applying comprises using the defined range of intensities to identify intensity values that yield non-printable regions.

5. The computer-implemented method of claim 1, wherein the step of applying comprises filtering the simulation data using the latitude of acceptable feature tolerances to identify manufacturable features of the chip layout.

6. The computer-implemented method of claim 1, wherein the step of applying comprises filtering the simulation data using the defined range of intensities to identify intensity values that yield non-printable regions, and filtering the simulation data using the latitude of acceptable feature tolerances to identify manufacturable features of the chip layout.

7. The computer-implemented method of claim 1, further comprising a step of representing the chip layout as a simulation grid and performing a simulation of the chip layouts to generate simulation data as intensity values for points on the grid.

8. The computer-implemented method of claim 1, further comprising a step of representing the chip layout as a bitmap, wherein each enabled bit represents a printable edge segment.

9. The computer-implemented method of claim 1, wherein the step of applying comprises using the defined range of intensities to identify intensity values that yield non-printable regions.

10. A computer storage device having a computer readable program embodied therein for causing a manufacturability verification process to be executed by a computer system, said computer readable program including:
- computer readable code for causing said computer system to define a range of intensities within which a feature linewidth is manufacturable to represent manufacturing behavior of the lithographic process;
- computer readable code for causing said computer system to define a feature latitude of acceptable feature tolerances that represents acceptable feature dimensions for the lithographic process; and
- computer readable code for causing said computer system to apply at least one of the range of intensities and the feature latitude to lithography simulation data for the chip layout to filter the simulation data based on manufacturability.

11. The computer storage device of claim 10, wherein the range of intensities is defined as an exposure latitude filter.

12. The computer storage device of claim 10, wherein the feature latitude is defined as a feature latitude filter.

13. The computer storage device of claim 10, wherein the step of applying comprises using the defined range of intensities to identify intensity values that yield nonprintable regions.

14. The computer storage device of claim 10, wherein the step of applying comprises filtering the simulation data using the latitude of acceptable feature tolerances to identify manufacturable features of the chip layout.

15. The computer storage device of claim 10, wherein the step of applying comprises filtering the simulation data using the defined range of intensities to identify intensity values that yield non-printable regions, and filtering the simulation data using the latitude of acceptable feature tolerances to identify manufacturable features of the chip layout.

16. The computer storage device of claim 10, further including computer readable code for causing said computer system to represent the chip layout as a simulation grid and preform a simulation of the chip layouts to generate simulation data as intensity values for points on the grid.

17. The computer storage device of claim 10, further including computer readable code for causing said computer system to represent the chip layout as a bitmap, wherein each enabled bit represents a printable edge segment.

18. A computer aided design tool, comprising:
- a processor; and
- a memory, coupled to the processor and having computer program code embodied therein for enabling the processor to perform the operations of:
- defining a range of intensities within which a feature linewidth is manufacturable to represent manufacturing behavior of the lithographic process;
- defining a feature latitude of acceptable feature tolerances that represents acceptable feature dimensions for the lithographic process; and
- applying at least one of the range of intensities and the feature latitude to lithography simulation data for the chip layout to filter the simulation data based on manufacturability.

19. The computer aided design tool of claim 18, wherein the range of intensities is defined as an exposure latitude filter.

20. The computer aided design tool of claim 18, wherein the feature latitude is defined as a feature latitude filter.

21. The computer aided design tool of claim 18, wherein the step of applying comprises filtering the simulation data using the latitude of acceptable feature tolerances to identify manufacturable features of the chip layout.

22. The computer aided design tool of claim 18, wherein the step of applying comprises filtering the simulation data using the defined range of intensities to identify intensity values that yield non-printable regions, and filtering the simulation data using the latitude of acceptable feature tolerances to identify manufacturable features of the chip layout.

23. The computer aided design tool of claim 18, further comprising a step of representing the chip layout as a simulation grid and performing a simulation of the chip layouts to generate simulation data as intensity values for points on the grid.

24. The computer aided design tool of claim 18, further comprising a step of representing the chip layout as a bitmap, wherein each enabled bit represents a printable edge segment.

* * * * *